US009130521B2

(12) United States Patent
Iwamoto

(10) Patent No.: US 9,130,521 B2
(45) Date of Patent: Sep. 8, 2015

(54) OPERATIONAL AMPLIFIER CIRCUIT

(71) Applicant: FUJI ELECTRIC CO., LTD., Kawasaki-shi (JP)

(72) Inventor: Motomitsu Iwamoto, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/243,084

(22) Filed: Apr. 2, 2014

(65) Prior Publication Data
US 2014/0300416 A1    Oct. 9, 2014

(30) Foreign Application Priority Data
Apr. 4, 2013  (JP) .................................. 2013-078911

(51) Int. Cl.
*H03F 3/45* (2006.01)
(52) U.S. Cl.
CPC .. *H03F 3/45219* (2013.01); *H03F 2203/45244* (2013.01)
(58) Field of Classification Search
USPC ................................................. 330/252–261
See application file for complete search history.

(56) References Cited

U.S. PATENT DOCUMENTS 7,109,697 B1    9/2006   Atrash et al.
8,040,180 B2 *  10/2011  Yen et al. ........................ 330/10

FOREIGN PATENT DOCUMENTS

JP         2008544727 A    12/2008

OTHER PUBLICATIONS

Kenji Taniguchi: "Introduction to CMOS Analogue Circuits for LSI Design" (in Japanese) First edition, published by CQ Publishing Co. Ltd., Dec. 2004, pp. 200-204.

* cited by examiner

*Primary Examiner* — Hieu Nguyen
(74) *Attorney, Agent, or Firm* — Rossi, Kimms & McDowell LLP

(57) ABSTRACT

Aspects of the invention include an operational amplifier circuit having a construction of a rail-to rail input folded circuit and includes an N-MOS differential pair composed of a pair of N-channel type MOS-FETs connected to a pair of voltage input terminals, and a P-MOS differential pair composed of a pair of P-channel type MOS-FETs connected to the pair of voltage input terminals. In some aspects, a comparator determines whether an common mode input voltage to the N-MOS differential pair and the P-MOS differential pair is higher than a half of a power supply voltage or not, and either one of the N-MOS differential pair and the P-MOS differential pair is selectively operated according to the comparison result. Active loads are provided separately for the N-MOS differential pair and for the P-MOS differential pair.

7 Claims, 4 Drawing Sheets

OPERATIONAL AMPLIFIER CIRCUIT

CROSS-REFERENCE TO RELATED APPLICATION

This application is based on, and claims priority to, Japanese Patent Application No. 2013-078911, filed on Apr. 4, 2013, the contents of which are incorporated herein by reference.

BACKGROUND OF THE INVENTION

1. Field of the Invention

Embodiments of the invention relate to operational amplifier circuits with a wide range of common mode input voltages and a decreased offset voltages.

2. Description of the Related Art

With a recent trends of single polarity of driving power supplies and decreased power supply voltage Vdd, operational amplifier circuits of a rail-to-rail input type are drawing attention in which an input voltage range is expanded over nearly power supply voltage width of GND to Vdd. For instance, a differential input circuit, which is a MOS differential pair composed of MOS-FETs, is connected in parallel with a cascode amplifier circuit to enhance a gain. Current imbalance between the MOS-FETs of the MOS differential pair is trimmed to cancel the offset voltage between the MOS differential pairs.

FIG. 3 shows an example of schematic construction of a conventional operational amplifier circuit of a P-MOS input folded cascode type provided with an offset voltage trimming circuit. The operational amplifier circuit of FIG. 3 includes a P-MOS differential pair A for differentially amplifying an common mode input voltage given to a pair of voltage input terminals INP and INM, and a current source B for biasing the P-MOS differential pair A. The P-MOS differential pair A is composed of a pair of MOS-FETs of a P channel type (hereinafter referred to simply as a P-MOS) 1a and 1b. The bias current source B is composed of a grounded-gate P-MOS 2.

The cascode circuit C of an input folded type for the P-MOS differential pair A is composed of an N-MOS cascode amplification stage and a P-MOS cascode amplification stage. The N-MOS cascode amplification stage consists of an N channel type MOS-FET (hereinafter referred to as an N-MOS) 3a, the source of which is connected to the drain of the P-MOS 1a, and an N-MOS 3b, the source of which is connected to the drain of the P-MOS 1b. The P-MOS cascode amplification stage consists of a pair of P-MOS 4a and P-MOS 4b that are cascode-connected to the respective drains of the N-MOS 3a and the N-MOS 3b. A pair of P-MOS 5a and P-MOS 5b forming a current mirror circuit are connected to the sources of the P-MOS 4a and the P-MOS 4b and works as a load on the P-MOS cascode amplification stage. This pair of P-MOSes 5a and 5b is an active load D acting through the cascode circuit C on the P-MOS differential pair A. The cascode circuit C connected in series to the active load D forms a grounded-gate amplifier circuit and increases the output resistance to enhance the gain of the operational amplifier.

N-MOSes 6a through 6f are provided in parallel with each other and connected through a switching circuit E to the drains of the P-MOSes 1a and 1b and the sources of the N-MOSes 3a and 3b. The N-MOSes 6a through 6f are loads on the N-MOS cascode amplification stage consisting of the N-MOSes 3a and 3b, and at the same time, construct a current source F for the P-MOS differential pair A and the cascode circuit C. The switching circuit E comprises switches 7a through 7f each series-connected to each drain of the N-MOSes 6a through 6f. These switches 7a through 7f performs selective ON/OFF operation and connect the P-MOS differential pair A and the cascode circuit C selectively to the current source F. Consequently, the switching circuit E and the current source F adjust the current to be drawn out of each of the P-MOSes 1a and 1b composing the MOS differential pair A. Thus, the switching circuit E and the current source F work as an offset voltage adjusting circuit, or a current trimming circuit, that corrects or trims the current imbalance between the P-MOS 1a and the P-MOS 1b.

When non-uniformity exists in characteristics between the P-MOSes 1a and 1b composing the P-MOS differential pair A or between the P-MOSes 5a and 5b composing the active load D, the non-uniformity causes imbalance between the current running through the P-MOS 1a and the current through the P-MOS 1b. This current imbalance changes the output voltage, which in turn is fed back to the P-MOS differential pair A so as to compensate for the current imbalance. As a result, the voltages applied to the P-MOSes 1a and 1b differs from each other and settles into the state the current imbalance has disappeared.

In this state, the difference in the voltage on the P-MOS 1a and on the P-MOS 1b is superimposed on the output voltage as an offset voltage. The current adjustment by the switching circuit E corrects, or trims, the current imbalance between the P-MOSes 1a and 1b to cancel this offset voltage. International Patent Application Publication No. WO 2007/002944 discloses techniques for trimming the offset voltage in an operational amplifier in detail.

FIG. 4 shows an example of schematic construction of a conventional operational amplifier circuit of a rail-to-rail input folded-cascode type. This operational amplifier circuit comprises, in addition to the operational amplifier having the construction shown in FIG. 3, an N-MOS differential pair G consisting of a pair of N-MOS-FETs 8a and 8b provided in parallel with the P-MOS differential pair A. The drains of the N-MOS-FETs 8a and 8b are connected to the corresponding sources of the pair of P-MOSes 4a and 4b in the cascode circuit C. The operational amplifier of FIG. 4 comprises a current source H for biasing the N-MOS differential pair G and is composed of a grounded gate N-MOS 9.

The operational amplifier shown in FIG. 4 is not provided with the current trimming circuit, a switching circuit E, for offset voltage regulation of the P-MOS differential pair A and the N-MOS differential pair G. Thus, the current source Fa for the P-MOS differential pair A is solely composed of the pair of N-MOSes 6a and 6b, and the operational amplifier circuit is not provided with the N-MOSes 6c through 6f used for adjusting current imbalance in the circuit of FIG. 3. In this operational amplifier circuit of FIG. 4, the active load D, P-MOSes 5a and 5b, on the P-MOS differential pair A functions as a current source for the N-MOS differential pair G, and the current source Fa, the N-MOSes 6a and 6b, for the P-MOS differential pair A functions as an active load on the N-MOS differential pair G.

In the operational amplifier circuit provided with the P-MOS differential pair A and the N-MOS differential pair G, either one of the P-MOS differential pair A and the N-MOS differential pair G operates normally in the input voltage range of the ground potential GND to the power supply voltage Vdd. Since an input voltage range of approximately the power supply voltage width, from GND to Vdd is obtained, the operational amplifier circuit is called a rail-to-rail input type operational amplifier circuit.

Kenji Taniguchi: "Introduction to CMOS Analogue Circuits for LSI Design" (in Japanese) First edition, published by CQ Publishing Co. Ltd., December 2004, pages 200-204. in detail about an operational amplifier circuit of a rail-to-rail input type.

In the operational amplifier circuit of a rail-to-rail type as shown in FIG. 4, if the current running through the P-MOS differential pair A, the P-MOSes 1 and 1*b*, is trimmed, for example, by the current source F provided in the operational amplifier circuit of FIG. 3, an offset voltage arises in the N-MOS differential pair G, the N-MOSes 8*a* and 8*b*. If the offset voltage in the N-MOS differential pair G, N-MOSes 8*a* and 8*b*, is cancelled, then an offset voltage arises in the P-MOS differential pair A, P-MOSes 1*a* and 1*b*. Thus, it is impossible to simultaneously cancel the offset voltage in the P-MOS differential pair A, P-MOSes 1*a* and 1*b*, and the offset voltage in the N-MOS differential pair G, N-MOSes 8*a* and 8*b*.

SUMMARY OF THE INVENTION

Embodiments of the invention address the above-described and other shortcomings in the prior art. Embodiments of the invention provide an operational amplifier circuit of a rail-to-rail type comprising a P-MOS differential pair and an N-MOS differential pair arranged in parallel to each other and connected to a pair of voltage input terminals, in which the operational amplifier circuit cancels separately an offset voltage of the P-MOS differential pair and an offset voltage of the N-MOS differential pair.

In some embodiments, an operational amplifier circuit of the invention is a rail-to-rail type operational amplifier circuit that comprises: an N-MOS differential pair composed of a pair of N-channel type MOS-FETs connected to a pair of voltage input terminals; an active load for the N-MOS differential pair connected to the N-MOS differential pair and a current source for the N-MOS differential pair connected to the N-MOS differential pair; an P-MOS differential pair composed of a pair of P-channel type MOS-FETs connected to the voltage input terminals and arranged in parallel to the N-MOS differential pair; an active load for the P-MOS differential pair connected to the P-MOS differential pair and a current source for the P-MOS differential pair connected to the P-MOS differential pair. In some embodiments, the operational amplifier circuit further comprises: a comparator that obtains an H level when an common mode input voltage given to the pair of voltage input terminals is higher than a half of a power supply voltage for driving the N-MOS differential pair and the P-MOS differential pair, and obtains an L level when the common mode input voltage is lower than a half of the power supply voltage; a switch for the N-MOS differential pair that delivers a current to the active load for the N-MOS differential pair and the current source for the N-MOS differential pair and makes the N-MOS differential pair operate solely when the output of the comparator is the H level; a switch for the P-MOS differential pair delivering a current to the active load for the P-MOS differential pair and the current source for the P-MOS differential pair and makes the P-MOS differential pair operate solely when the output of the comparator is the L level; a trimming means for the N-MOS differential pair that adjusts a driving capability of the current source for the N-MOS differential pair to minimize an offset voltage in operation of the N-MOS differential pair; and a trimming means for the P-MOS differential pair that adjusts a driving capability of the current source for the P-MOS differential pair to minimize an offset voltage in operation of the P-MOS differential pair.

In some embodiments, a rail-to-rail type operational amplifier circuit featured by provision of a comparator that determines whether an common mode input voltage to the N-MOS differential pair and the P-MOS differential pair is higher than a half of a power supply voltage or not, and either one of the N-MOS differential pair and the P-MOS differential pair is selectively operated. Active loads are provided separately for the N-MOS differential pair and for the P-MOS differential pair; and current sources are also provided separately for the N-MOS differential pair and for the P-MOS differential pair. Further, trimming means are likewise provided separately to adjust the driving capability of respective current sources.

In some embodiments, the switch for the N-MOS differential pair comprises: a switch for the N-MOS active load that delivers a current to the active load for the N-MOS differential pair, a switch for the N-MOS current source that adjusts a current to deliver to the current source for the N-MOS differential pair, and a switch for ON/OFF operation of the N-MOS differential pair that operates the N-MOS differential pair. The switch for the P-MOS differential pair comprises: a switch for the P-MOS active load that delivers a current to the active load for the P-MOS differential pair, a switch for the P-MOS current source that adjusts a current to deliver to the current source for the P-MOS differential pair, and a switch for ON/OFF operation of the P-MOS differential pair that operates the P-MOS differential pair.

Specifically, in some embodiments, the switch for the N-MOS active load, the switch for the N-MOS current source, and the switch for ON/OFF operation of the N-MOS differential pair are composed of N channel type MOS-FETs. The switch for the P-MOS active load, the switch for the P-MOS current source, and the switch for ON/OFF operation of the P-MOS differential pair are composed of P channel type MOS-FETs.

In some embodiments, the current source for the N-MOS differential pair is composed of a plurality of P channel type MOS-FETs provided in parallel, and the switch for the N-MOS current source is composed of a plurality of P channel type MOS-FETs that are connected in series to the respective P channel type MOS-FETs composing the current source for the N-MOS differential pair. The trimming means for the N-MOS differential pair is an ON/OFF controlling means that selectively drives into conduction the plurality of P channel type MOS-FETs composing the switch for the N-MOS current source.

In some embodiments, the current source for the P-MOS differential pair is composed of a plurality of N channel type MOS-FETs provided in parallel, and the switch for the P-MOS current source is composed of a plurality of N channel type MOS-FETs that are connected in series to the respective N channel MOS-FETs composing the current source for the P-MOS differential pair. The trimming means for the P-MOS differential pair is an ON/OFF controlling means that selectively drives into conduction the plurality of N channel type MOS-FETs composing the switch for the P-MOS current source.

In some embodiments, the comparator has a hysteresis characteristic.

In some embodiments, the operational amplifier circuit of the invention further comprises a cascode circuit of an input folded type, the cascode circuit being composed of an N-MOS cascode amplification stage and a P-MOS cascode amplification stage that are cascode-connected with each other and parallel-connected to the N-MOS differential pair and the P-MOS differential pair to raise an output resistance, the N-MOS cascode amplification stage being composed of a pair of N channel type MOS-FETs and the P-MOS cascode amplification stage being composed of a pair of P channel type MOS-FETs.

In some embodiments, a comparator determines whether an common mode input voltage given to the N-MOS differential pair and the P-MOS differential pair from a pair of voltage input terminals is higher than a half of a power supply voltage or not. When the common mode input voltage is higher than a half of the power supply voltage, current is delivered to the active load for the N-MOS differential pair and the current source for the N-MOS differential pair to operate solely the N-MOS differential pair. On the contrary, when the common mode input voltage is lower than a half the power supply voltage, current is delivered to the active load for the P-MOS differential pair and the current source for the P-MOS differential pair to operate solely the P-MOS differential pair In some embodiments, an operational amplifier circuit of the invention adjusts a driving capability of the current source for the N-MOS differential pair to minimize an offset voltage in operation of the N-MOS differential pair, and adjusts a driving capability of the current source for the P-MOS differential pair to minimize an offset voltage in operation of the P-MOS differential pair. Thus, only one of the N-MOS differential pair and the P-MOS differential pair is operated according to the level of the common mode input voltage, thereby separately adjusting the offset voltage in the N-MOS differential pair and the offset voltage in the P-MOS differential pair.

Consequently, interference of offset voltage adjustment does not occur between the N-MOS differential pair and the P-MOS differential pair, which has been the case in conventional circuits. Thus, cancellation of an offset in output voltage is assured. The offset voltage is held low in addition to a wide range of a common mode input voltage owing to the construction of a rail-to-rail type operational amplifier circuit comprising the N-MOS differential pair and the P-MOS differential pair. An operational amplifier circuit of the invention eliminates a circuit for achieving a constant mutual inductance gm, i.e. a so-called constant gm circuit, which has been needed by traditional operational amplifier circuits of an input folded type, which is one of great advantages of the invention.

DETAILED DESCRIPTION

The following describes in detail an operational amplifier circuit according to a embodiments of the invention with reference to the accompanying drawings.

Figure 1:
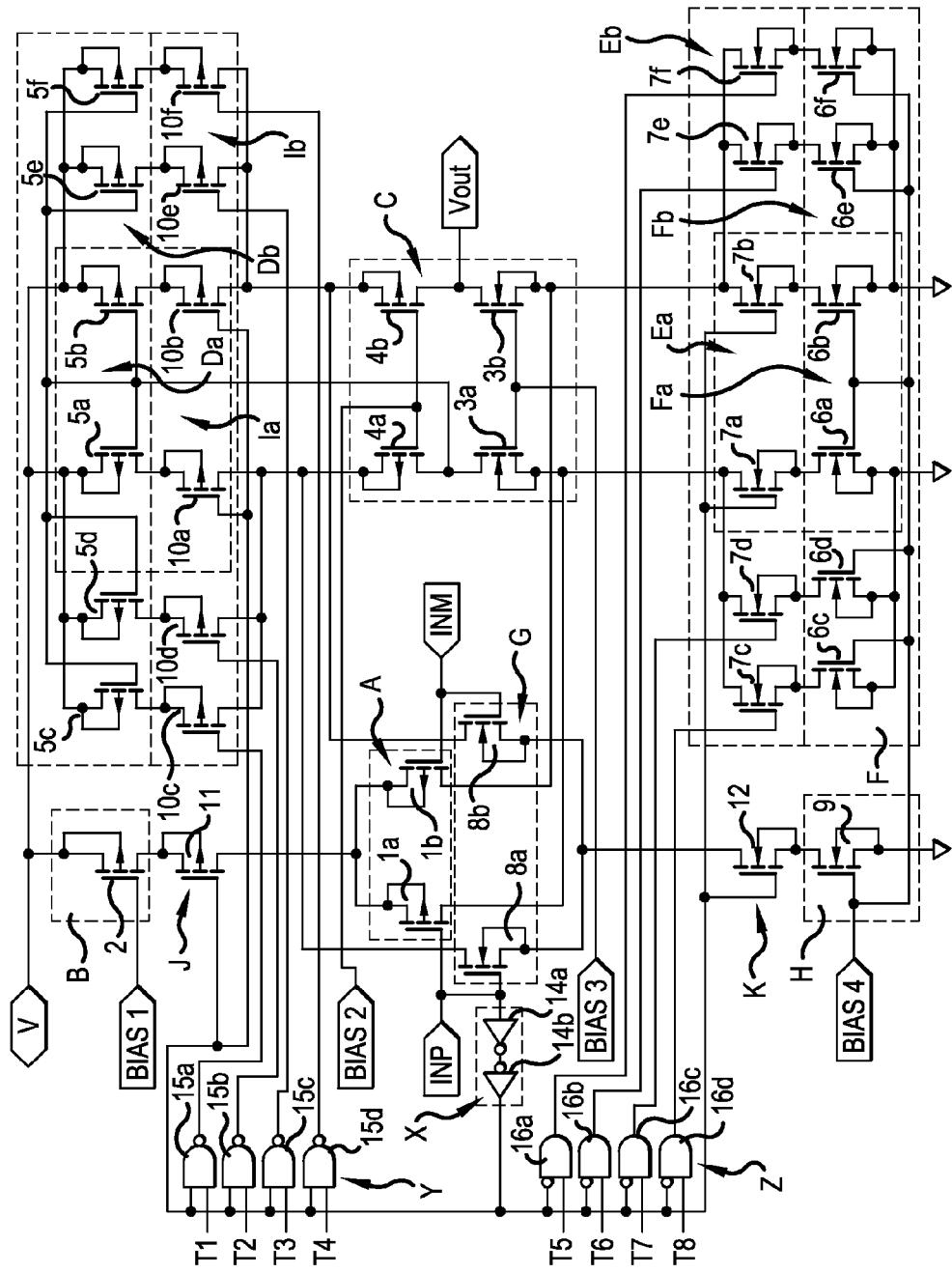
FIG. 1 shows a schematic construction of an operational amplifier circuit according to an embodiment of the invention.
Figure 3:
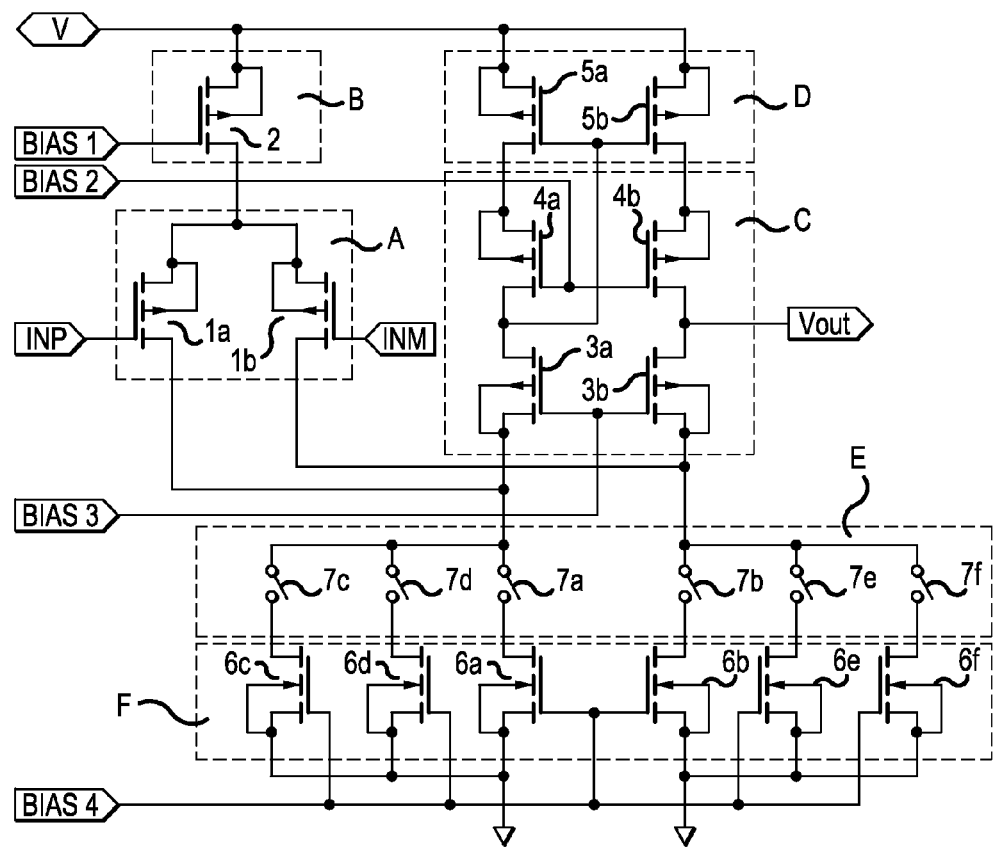
FIG. 3 shows an example of schematic construction of a conventional operational amplifier circuit of a P-MOS input folded-cascode type provided with an offset voltage trimming circuit.
Figure 4:
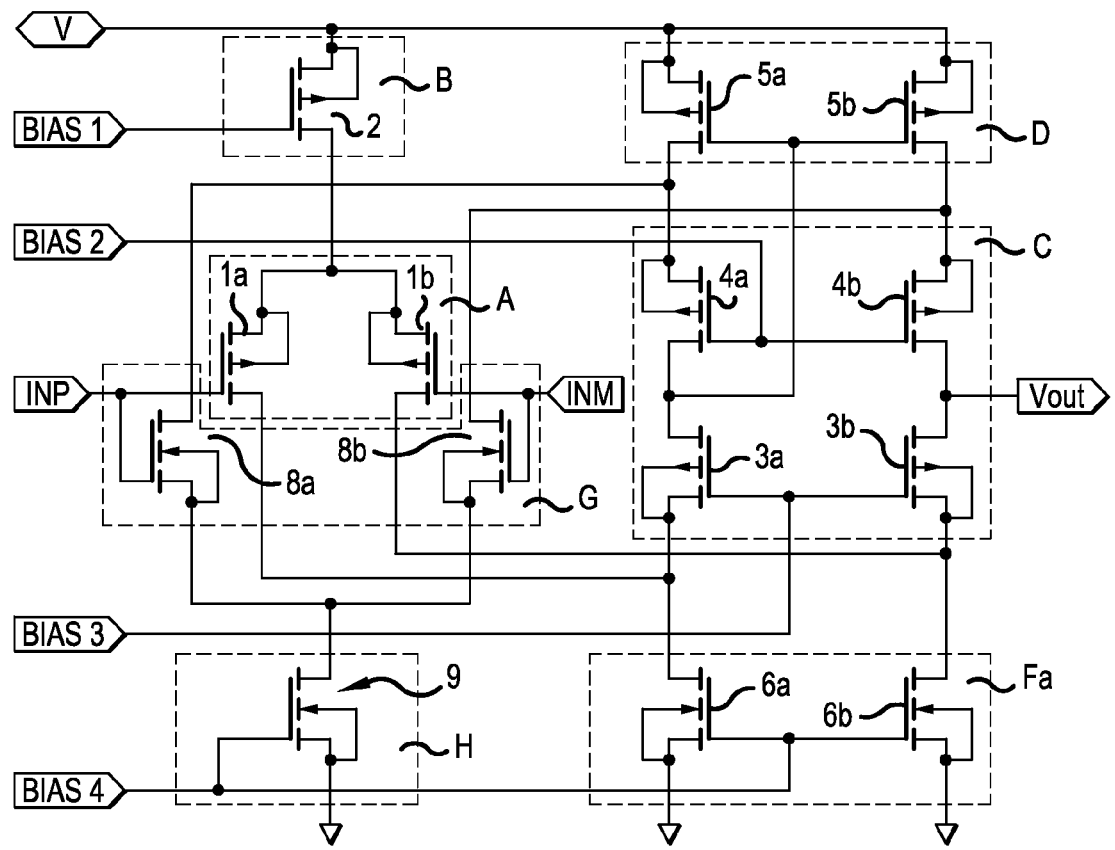
FIG. 4 shows an example of schematic construction of a conventional operational amplifier circuit of a rail-to-rail input folded-cascode type.

FIG. 1 shows a schematic construction of an operational amplifier circuit of a rail-to-rail input folded-cascode type according to an embodiment of the invention. The operational amplifier circuit is provided with an offset voltage trimming circuit. The same parts in FIG. 1 as those in FIGS. 3 and 4 are given the same symbols and repeated description is avoided.

Principal features of the operational amplifier circuit are that the active load, the current source, and the trimming means for adjusting the driving capability of the current source are provided separately for the N-MOS differential pair G and for the P-MOS differential pair A, and that either one of the N-MOS differential pair and the P-MOS differential pair A is selectively operated according to the decision whether the common mode input voltage is higher than a half of the power supply voltage Vdd or not.

In the embodiment shown in FIG. 1, the pair of P-MOSes 5a and 5b, which can function simultaneously as an active load on the P-MOS differential pair A and as a current source for the N-MOS differential pair G, is used as a dedicated active load Da for the P-MOS differential pair A. A main power supply for the P-MOS differential pair A is the bias current source B composed of the P-MOS 2. A current source Fb for the P-MOS differential pair A is composed of the plurality of the N-MOSes 6c to 6f that are connected in parallel to the pair of N-MOSes 6a and 6b. More specifically, the current source Fb for the P-MOS differential pair for current trimming of the P-MOS differential pair A is composed of the N-MOSes 6c and 6d connected in parallel to the N-MOS 6a and the N-MOSes 6e and 6f connected in parallel to the N-MOS 6b.

The pair of N-MOSes 6a and 6b, which can function simultaneously as a current source of the P-MOS differential pair A and as an active load on the N-MOS differential pair G, is used as a dedicated active load Fa for the N-MOS differential pair G. A main power supply for the N-MOS differential pair G is the N-MOS bias current source H composed of the N-MOS 9. A current source Db for current trimming of the N-MOS differential pair G is composed of newly provided plurality of P-MOSes 5c to 5f that are connected in parallel to the pair of P-MOSes 5a and 5b. More specifically, the current source Db for the N-MOS differential pair for current trimming of the N-MOS differential pair G is composed of the P-MOSes 5c and 5d connected in parallel to the P-MOS 5a and the P-MOSes 5e and 5f connected in parallel to the P-MOS 5b.

On the basic construction of the operational amplifier circuit, the pair of N-MOSes 7a and 7b are used as a switch Ea for an N-MOS active load for selectively connecting the active load Fa, N-MOSes 6a and 6b, for the N-MOS differential pair to the N-MOS differential pair G. N-MOSes 7c through 7f connected in parallel to the pair of N-MOSes 7a and 7b are used as a switch Eb for the P-MOS current source, which is a trimming means for the P-MOS differential pair, for selectively connecting the current source Fb, which is N-MOSes 6c through 6f, for the P-MOS differential pair A.

A switch Ia for the P-MOS active load selectively connects the active load Da, which is P-MOSes 5a and 5b, for the P-MOS differential pair to the P-MOS differential pair A. The switch Ia is composed of P-MOSes 10a and 10b that are newly inserted between the P-MOS differential pair A and the active load Da, which is the P-MOSes 5a and 5b, for the P-MOS differential pair. A switch Ib for the N-MOS current source selectively connects the current source Db, which is P-MOSes 5c through 5f, for the N-MOS differential pair to the N-MOS differential pair G. The switch Ib is composed of P-MOSes 10c through 10f that are newly inserted between the current source Db, which is P-MOSes 5c through 5f, and the cascode circuit C for the N-MOS differential pair G.

Between the P-MOS differential pair A and the current source B, which is a P-MOS 2, for P-MOS biasing, a switch J, which is a P-MOS 11, for ON/OFF controlling the P-MOS differential pair is provided for selectively operating the P-MOS differential pair A. Between the N-MOS differential pair G and the current source H, which is an N-MOS 9, for N-MOS biasing, a switch K, which is an N-MOS 12, for ON/OFF controlling the N-MOS differential pair is provided for selectively operating the N-MOS differential pair G.

In short, for the P-MOS differential pair A, the current source B, which is the P-MOS 2, for biasing the P-MOS differential pair is provided through the switch J, which is the p-MOS 11, for ON/OFF controlling the P-MOS differential pair, and for the P-MOS differential pair A, also provided is the P-MOS active load Da, which is the P-MOSes 5a and 5b, through the switch Ia, which is the P-MOSes 10a and 10b, for the P-MOS active load. For the P-MOS differential pair A, further provided is the current source Fb, which is the P-MOSes 6c through 6f, for the P-MOS differential pair through the switch Eb, which is N-MOSes 7c through 7f, for the P-MOS current source.

Similarly, for the N-MOS differential pair G, the current source H, which is the N-MOS 9, for biasing the N-MOS differential pair is provided through the switch K, which is the N-MOS 12, for ON/OFF controlling the N-MOS differential pair, and also provided is the N-MOS active load Fa, which is the N-MOSes 6a and 6b, through the switch Ea, which is the N-MOSes 7a and 7b, for the N-MOS active load. For the N-MOS differential pair G, further provided is the current source Db, which is the P-MOSes 5c through 5f, for the N-MOS differential pair through the switch Ib, which is the P-MOSes 10c through 10f, for the N-MOS current source.

In addition to the construction described above, the operational amplifier circuit of the embodiment comprises a comparator X that obtains an output at an H level when an common mode input voltage applied in parallel to the P-MOS differential pair A and the N-MOS differential pair G, the common mode input voltage being, for example, an input voltage Vin (+) given to the voltage input terminal INP, is higher than a half of the power supply voltage Vdd. The comparator X obtains an output at an L level when the common mode input voltage is lower than a half of the power supply voltage Vdd. The comparator X is actualized by connecting in series two logical inverter circuits, i.e. NOT circuits, 14a and 14b that have a logical threshold value of about a half the power supply voltage Vdd.

The comparator X can be alternatively actualized by using a comparing circuit that compares the input voltage Vin (+) with a predetermined reference voltage Vref, which equals Vdd/2, for example, and reverses the output into an H level or an L level according the comparison result. In that case, the reference voltage Vref for the comparing circuit is not necessarily exactly a half the power supply voltage Vdd but can be sufficiently about a half the power supply voltage Vdd.

When the input voltage Vin(+) is higher than a half of the power supply voltage Vdd, the output at an H level of the comparator X ON-drives the switch K, which is the N-MOS 12, for ON/OFF controlling the N-MOS differential pair and switch Ea, which is the N-MOSes 7a and 7b, for the N-MOS active load. At the same time, a switch selection circuit Y, i.e. a trimming means for the N-MOS differential pair, selectively ON-drives the switch Ib, which is P-MOSes 10c through 10f, for the N-MOS current source. As a result, the N-MOS differential pair G is connected to the current supply H for biasing the N-MOS differential pair and to the current source Db for the N-MOS differential pair. At the same time, the N-MOS differential pair G is connected to the active load Fa for the N-MOS differential pair through the cascode circuit C and the switch Ea for the N-MOS active load, the switch Ea being composed of the N-MOSes 7a and 7b.

The switch selection circuit Y for N-MOS is composed of NAND circuits 15a through 15d that delivers current trimming control signals T1 through T4 to the gates of the P-MOSes 10c through 10f of the switch Ib for the N-MOS current supply to selectively turn ON the P-MOSes 10c through 10f when the output of the comparator X is at an H level. Consequently, the current to flow through each of the pair of N-MOSes 8a and 8b composing the N-MOS differential pair G is determined corresponding to the current trimming control signals T1 through T4. Thus, current trimming is performed on the N-MOS differential pair G.

On the contrary, when the input voltage Vin(+) is lower than a half the power supply voltage Vdd, the output at an L level of the comparator X ON-drives the switch J, which is the P-MOS 11, for ON/OFF controlling the P-MOS differential pair and switch Ia, which is the P-MOSes 10a and 10b, for the P-MOS active load. At the same time, a switch selection circuit Z, i.e. a trimming means for the P-MOS differential pair, selectively ON-drives the switch Eb, which is N-MOSes 7c through 7f, for the P-MOS current source. As a result, the P-MOS differential pair A is connected to the current source B for biasing the P-MOS differential pair and to the current source Fb for the P-MOS differential pair. At the same time, the P-MOS differential pair A is connected to the active load Da for the P-MOS differential pair through the cascode circuit C and the switch Ia for the P-MOS active load, the switch Ia being composed of the P-MOSes 10a and 10b.

The P-MOS switch selection circuit Z is composed of AND circuits 16a through 16d that deliver current trimming control signals T5 through T8 to the gates of the N-MOSes 7c through 7f of the switch Eb for the P-MOS current source to selectively turn ON the N-MOSes 7c through 7f when the output of the comparator X is at an L level. Consequently, the current to flow through each of the pair of P-MOSes 1a and 1b composing the P-MOS differential pair A is determined corresponding to the current trimming control signals T5 through T8. Thus, current trimming is performed on the P-MOS differential pair A.

The operational amplifier circuit having the construction as described above is controlled corresponding to the output of the comparator X so that the N-MOS differential pair G solely operates when the common mode input voltage Vin is higher than a half of the power supply voltage Vdd, and the P-MOS differential pair A solely operates when the common mode input voltage Vin is lower than a half the power supply voltage Vdd. Thus, as shown by the mode (b) in FIG. 2, the operation domains for the P-MOS differential pair A and the N-MOS differential pair G can be complementarily divided corresponding to the magnitude of the common mode input voltage Vin, more specifically, discriminated at the boundary of the potential of a half the power supply voltage Vdd.

Figure 2:
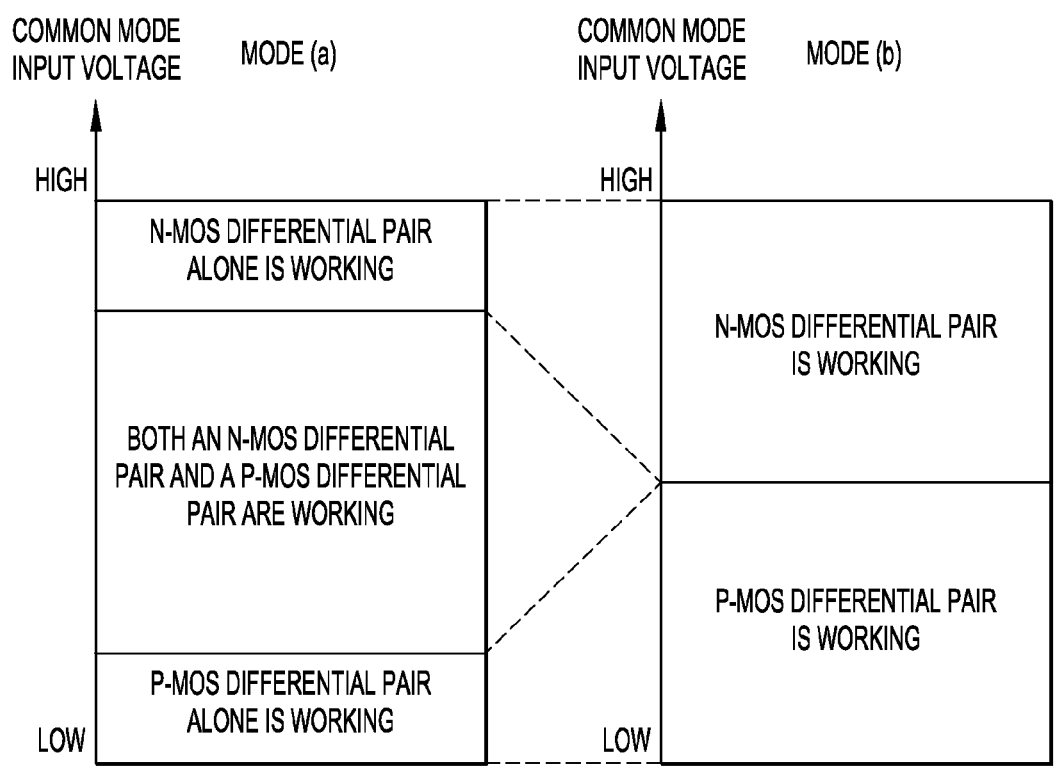
FIG. 2 shows operation domains of the N-MOS differential pair and the P-MOS differential pair for common mode input voltages.

In conventionally general rail-to-rail type operational amplifier circuits as shown in the mode (a) in FIG. 2, a P-MOS differential pair A and an N-MOS differential pair G operate simultaneously unless the common mode input voltage Vin approaches the ground potential GND or zero volts, or the power supply voltage Vdd. If the common mode input voltage Vin is approximately the ground potential GND or zero volts, the P-MOS differential pair A solely operates; and if the common mode input voltage Vin is approximately the power supply voltage Vdd, the N-MOS differential pair G solely operates.

As a consequence, there has been an inconvenience that if an offset voltage of the P-MOS differential pair A is adjusted by current trimming for the P-MOS differential pair A, the adjustment affects the N-MOS differential pair G; and if an offset voltage of the N-MOS differential pair G is adjusted by current trimming for the N-MOS differential pair G, the adjustment affects the P-MOS differential pair A.

Concerning this issue, the operational amplifier circuit of the embodiment operates the P-MOS differential pair A and the N-MOS differential pair G alternatively corresponding to the magnitude of the common mode input voltage Vin. Therefore, a current trimming process on the N-MOS differential pair G does not affect the P-MOS differential pair A because the P-MOS differential pair A itself is out of operation; and a current trimming process on the P-MOS differential pair A does not affect the N-MOS differential pair G because the N-MOS differential pair G itself is out of operation.

Consequently, adjustment of the offset voltage can be carried out individually for the P-MOS differential pair A and for the N-MOS differential pair G without interference with each other. As a result, it is possible to cancel both of the offset voltage caused by scattering of the characteristics of the pair of P-MOSes 1a and 1b composing the P-MOS differential pair A and the offset voltage caused by scattering of the characteristics of the pair of N-MOSes 8a and 8b composing the N-MOS differential pair G. Thus, the output voltage Vout can be obtained corresponding to the common mode input voltage Vin with high accuracy in the range from the ground potential GND, zero volts, to the power supply voltage Vdd.

Because the operational amplifier circuit of the embodiment alternatively operates the P-MOS differential pair A and the N-MOS differential pair G corresponding to the magnitude of the common mode input voltage Vin, no interference occur between the P-MOS differential pair A and the N-MOS differential pair G. Thus, a so-called constant gm circuit is not required, which is needed by conventionally general rail-to-rail type operational amplifier circuits. The simplified circuit construction is a great advantage in practical application.

The embodiments are not limited to the embodiment described thus far. While description has been made on the input folded type operational amplifier having a cascode circuit C, the present invention can be applied to operational amplifier circuits without the cascode circuit C as well: to rail-to-rail type operational amplifiers having only an output buffer circuit at the output stage of the P-MOS differential pair A and the N-MOS differential pair G.

In the embodiment, two MOS-FETs for current trimming are provided for each of the MOS-FETs of the pair of P-MOSes 1a and 1b composing the P-MOS differential pair A and the pair of N-MOSes 8a and 8b composing the N-MOS differential pair G, and the MOS-FETs are selectively operated. However, the number of MOS-FETs for current trimming can be increased to perform more precise current trimming for the offset voltage. While the threshold value of the comparator X is a constant value in the embodiment, the comparator X can have a hysteresis characteristic, of course. Other any variations and modifications are possible without departing from the spirit and scope of the invention.

What is claimed is:
1. An operational amplifier circuit comprising:
   an N-MOS differential pair composed of a pair of N-channel type MOS-FETs connected to a pair of voltage input terminals;
   an active load for the N-MOS differential pair connected to the N-MOS differential pair and a current source for the N-MOS differential pair connected to the N-MOS differential pair;
   a P-MOS differential pair composed of a pair of P-channel type MOS-FETs connected to the voltage input terminals and arranged in parallel to the N-MOS differential pair;
   an active load for the P-MOS differential pair connected to the P-MOS differential pair and a current source for the P-MOS differential pair connected to the P-MOS differential pair;
   a comparator that obtains an H level when an common mode input voltage given to the pair of voltage input terminals is higher than a half of a power supply voltage for driving the N-MOS differential pair and the P-MOS differential pair, and obtains an L level when the common mode input voltage is lower than a half of the power supply voltage;
   a switch for the N-MOS differential pair, the switch delivering a current to the active load for the N-MOS differential pair and the current source for the N-MOS differential pair and makes the N-MOS differential pair operate solely when the output of the comparator is the H level;
   a switch for the P-MOS differential pair, the switch delivering a current to the active load for the P-MOS differential pair and the current source for the P-MOS differential pair and makes the P-MOS differential pair operate solely when the output of the comparator is the L level;
   a trimming means for the N-MOS differential pair that adjusts a driving capability of the current source for the N-MOS differential pair to minimize an offset voltage in operation of the N-MOS differential pair; and
   a trimming means for the P-MOS differential pair that adjusts a driving capability of the current source for the P-MOS differential pair to minimize an offset voltage in operation of the P-MOS differential pair.

2. The operational amplifier circuit according to claim 1, wherein
   the switch for the N-MOS differential pair comprises:
      a switch for the N-MOS active load that delivers a current to the active load for the N-MOS differential pair,
      a switch for the N-MOS current source that adjusts a current to deliver to the current source for the N-MOS differential pair, and
      a switch for ON/OFF operation of the N-MOS differential pair; and
   the switch for the P-MOS differential pair comprises:
      a switch for the P-MOS active load that delivers a current to the active load for the P-MOS differential pair,
      a switch for the P-MOS current source that adjusts a current to deliver to the current source for the P-MOS differential pair, and
      a switch for ON/OFF operation of the P-MOS differential pair.

3. The operational amplifier circuit according to claim 2, wherein
   the switch for the N-MOS active load, the switch for the N-MOS current source, and the switch for ON/OFF operation of the N-MOS differential pair are composed of N channel type MOS-FETs; and
   the switch for the P-MOS active load, the switch for the P-MOS current source, and the switch for ON/OFF operation of the P-MOS differential pair are composed of P channel type MOS-FETs.

4. The operational amplifier circuit according to claim 1, wherein
   the current source for the N-MOS differential pair is composed of a plurality of P channel type MOS-FETs provided in parallel, and the switch for the N-MOS current source is composed of a plurality of P channel type MOS-FETs that are connected in series to the respective P channel MOS-FETs composing the current source for the N-MOS differential pair; and the trimming means for the N-MOS differential pair is an ON/OFF controlling means that selectively drives into conduction the plurality of P channel type MOS-FETs composing the switch for the N-MOS current source.

5. The operational amplifier circuit according to claim 1, wherein the current source for the P-MOS differential pair is composed of a plurality of N channel type MOS-FETs provided in parallel, and the switch for the P-MOS current source is composed of a plurality of N channel type MOS-FETs that are connected in series to the respective N channel MOS-FETs composing the current source for the P-MOS differential pair; and the trimming means for the P-MOS differential pair is an ON/OFF controlling means that selectively drives into conduction the plurality of N channel type MOS-FETs composing the switch for the P-MOS current source.

6. The operational amplifier circuit according to claim 1, wherein the comparator has a hysteresis characteristic.

7. The operational amplifier circuit according to claim 1, further comprising a cascode circuit of an input folded type, the cascode circuit being composed of an N-MOS cascode amplification stage and a P-MOS cascode amplification stage that are cascode-connected with each other and parallel-connected to the N-MOS differential pair and the P-MOS differential pair to raise an output resistance, the N-MOS cascode amplification stage being composed of a pair of N channel type MOS-FETs and the P-MOS cascode amplification stage being composed of a pair of P channel type MOS-FETs.

* * * * *